United States Patent [19]

Figueroa et al.

[11] Patent Number: 5,993,979
[45] Date of Patent: Nov. 30, 1999

[54] SKELETAL COLUMNAR COATINGS

[75] Inventors: Juan Carlos Figueroa; Ronald Horace Mattson, Sr., both of Wilmington, Del.

[73] Assignee: E. I. du Pont de Nemours and Company, Wilmington, Del.

[21] Appl. No.: 08/841,135

[22] Filed: Apr. 29, 1997

[51] Int. Cl.[6] ............................ B22D 25/00; C03C 27/02; B32B 3/26

[52] U.S. Cl. ............................ 428/610; 428/613; 428/632; 428/650; 428/670; 428/312.8; 428/314.2; 428/315.5; 502/325; 502/326; 502/327; 502/330; 502/331; 502/332; 502/334

[58] Field of Search .................... 428/610, 613, 428/632, 650, 670, 312.8, 314.2, 315.5; 502/325, 326, 327, 330, 331, 332, 334

[56] References Cited

U.S. PATENT DOCUMENTS

| | | | |
|---|---|---|---|
| 3,849,177 | 11/1974 | Fernandes | 117/71 R |
| 3,867,309 | 2/1975 | Oleck et al. | 252/455 R |
| 3,902,234 | 9/1975 | Fernandes | 29/132 |
| 4,211,672 | 7/1980 | Sonetaka et al. | 252/455 R |
| 4,292,208 | 9/1981 | Baldi et al. | 252/470 |
| 4,349,612 | 9/1982 | Baldi | 428/607 |
| 4,608,319 | 8/1986 | Croopnick et al. | 428/613 |
| 4,784,984 | 11/1988 | Yamanaka et al. | 502/439 |
| 5,403,620 | 4/1995 | Kaesz et al. | 427/252 |
| 5,559,065 | 9/1996 | Lauth et al. | 502/5 |

FOREIGN PATENT DOCUMENTS

| | | |
|---|---|---|
| 0 091 028 | 10/1983 | European Pat. Off. . |
| 43 34 086 A1 | 4/1994 | Germany . |
| 1145357 | 3/1969 | United Kingdom . |
| WO 95/25590 | 9/1995 | WIPO . |

OTHER PUBLICATIONS

John A. Thornton, Influence of substrate temperature and deposition rate on structure of thick sputtered Cu coatings, *J. Vac. Sci. Technol.*, 12, No. 4, 830–835, Jul./Aug. 1975.

Russell Messier et al., Geometry of thin–film morphology, *J. Appl. Phys.*, 58 (10), 3739–3746, Nov. 15, 1985.

J. Freel et al., The Structure of Raney Nickel, Journal of Catalysts, 14, 247–256, Dec. 30, 1968.

K. Robbie et al., Fabrication of thin films with highly porous microstructures, *J. Vac. Sci. Technol.*, A 13 (3), 1032–1035, May/Jun. 1995.

Jorge Laine et al., Preparation and Characterization of a Plate–Supported Raney Copper Catalyst, *Ind. Eng. Chem. Res.*, 28, 146–149, 1989.

J. Laine et al., Structure and activity of a Raney copper film catalyst, *Catalysis Letters*, 10, 11–17, 1991.

B.A. Movchan et al., Study of the Structure and Properties of Thick Vacuum Condensates of Nickel, Titanium, Tungsten, Aluminium Oxide and Zirconium Dioxide, Fiz.metal. metallowed., 28, No., 4, 653–660, 1969.

N. Korovin et al., Hydrogen Electrodes With Surface Skeleton Catalysts, *International Journal of Hydrogen Energy*, 17, No. 12, 929–934, 1992.

*Primary Examiner*—D. S. Nakarani
*Assistant Examiner*—Holly C. Rickman

[57] ABSTRACT

Skeletal columnar coatings with a well-adhered columnar having both intercolumn and intracolumn porosity are metallic alloys of catalytic elements and non-catalytic elements and are particularly useful in making catalytic surfaces, electro-active surfaces and self-cleaning surfaces.

10 Claims, 5 Drawing Sheets

SKELETAL COLUMNAR COATINGS

BACKGROUND OF THE INVENTION

This invention concerns skeletal columnar coatings, a process for the preparation of said skeletal columnar coatings and the use of these skeletal columnar coatings as catalysts.

J. Laine et al, *Ind. Eng. Chem. Res.*, 28, 146–149 (1989), and J. Laine et al., *Catalysis Letters*, 10, 11–18 (1991), disclose a method for the preparation of a Raney copper catalyst in the form of a film deposited on a stainless steel plate. The alloy film consisted of $Al_2Cu$ grains dispe an alloy ground film. U.S. Pat. No. 3,849,177 and U.S. Pat. No. 3,902,234, disclose textile yarn processing rolls with a ceramic coating having a dispersion of fine catalytic Pt particles, a method for preparing said processing rolls and their use as self-cleaning rolls. DE 43 34 086 A1 discloses spinning devices coated with a thin layer of a catalyst that promotes oxidation. Preferred catalysts are platinum or platinum doped with palladium. Skeletal columnar coatings are not disclosed.

SUMMARY OF THE INVENTION

This invention provides skeletal columnar coatings comprising a well-adhered columnar structure, said columnar structure having both intercolumn and intracolumn porosity.

In a preferred embodiment, the columnar coatings comprise a metal alloy having a catalytic alloying element selected from the group consisting of cobalt, copper, gold, iridium, nickel, palladium, platinum, rhenium, rhodium, ruthenium and silver, and combinations thereof, and a non-catalytic alloying element selected from the group consisting of aluminum, chromium, hafnium, magnesium, molybdenum, niobium, tantalum, tin, titanium, tungsten, vanadium, zinc and zirconium, and combinations thereof.

This invention further provides a process for the preparation of skeletal columnar coatings comprising a well-adhered columnar structure, said columnar structure having both intercolumn and intracolumn porosity, said process comprising the steps of a) forming an adherent interlayer on a substrate;

b) forming an overlayer that is a precursor to a skeletal columnar coating comprising a metal/leachable material composite on said adherent layer;

c) thermally stabilizing said adherent interlayer and precursor overlayer;

d) leaching preferentially said leachable material from said precursor overlayer comprising a metal/leachable material composite;

e) optionally, exposing said skeletal columnar coating to either an oxidizing or a reducing environment.

This invention further provides a process for the use of well-adhered skeletal columnar coatings having a columnar structure, said columnar structure having both intercolumn and intracolumn porosity as a catalytic surface.

BRIEF DESCRIPTION OF THE FIGURES

FIG. 5 shows a scanning electron micrograph, in cross section, of leached composite material (equal weight Pt/Al alloy) deposited on 316 stainless steel

DETAILED DESCRIPTION OF THE EMBODIMENTS

This invention provides skeletal columnar coatings having utility as catalytic surfaces. Applications of interest for the improved catalytic coatings of the present invention include the removal, through oxidative processes, of organic deposits from fiber and film processing equipment, including the elimination of drips from spinning and extrusion dies, and use as supported catalysts in chemical processes.

Modifying the surface of critical process components, by incorporation of a "self-cleaning" catalytic surface is a low capitalization route to improved process performance. There is a need for "self-cleaning" catalytic coatings which have superior mechanical stability and catalytic performance compared to those known in the art. Catalytic coatings known in the art are typically derived from the pyrolysis of surface applied (i.e., painted-on) organometallic materials, or are prepared via wet chemical surface modification means. Generally, coatings prepared by these processes are not sufficiently durable in use.

In chemical processes, catalysts are regularly used in the variously configured chemical reactors in the form of pellets or powders. The handling of these product forms during their introduction to the reactor and their removal from the reactor regularly presents difficulties. Loss of catalyst from the reactor during the duration of the chemical process is another potential deficiency of the pellet or powder product form.

Porous ceramic supports can be used as catalyst supports. However, these have been found to be subject to attrition phenomena because of their poor strength. In addition, they are subject to undesirable "hot spots" when operating under highly exothermic reaction conditions, due to the low thermal conductivity of these materials.

The skeletal columnar coatings of the present invention are less subject to attrition than are ceramic supported catalysts and, due to the higher thermal conductivity of metals compared to ceramic materials, are less subject to "hot spot" formation.

The process of the present invention yields novel structures and compositions of matter. The process of this invention permits the deposition of these novel coatings onto thin wires or sheets, which offers the opportunity to fabricate catalytic metallic monoliths which can offer improved performance of reactors in terms of better temperature control of exothermic reactions and reduced pressure drops.

Figure 1A:
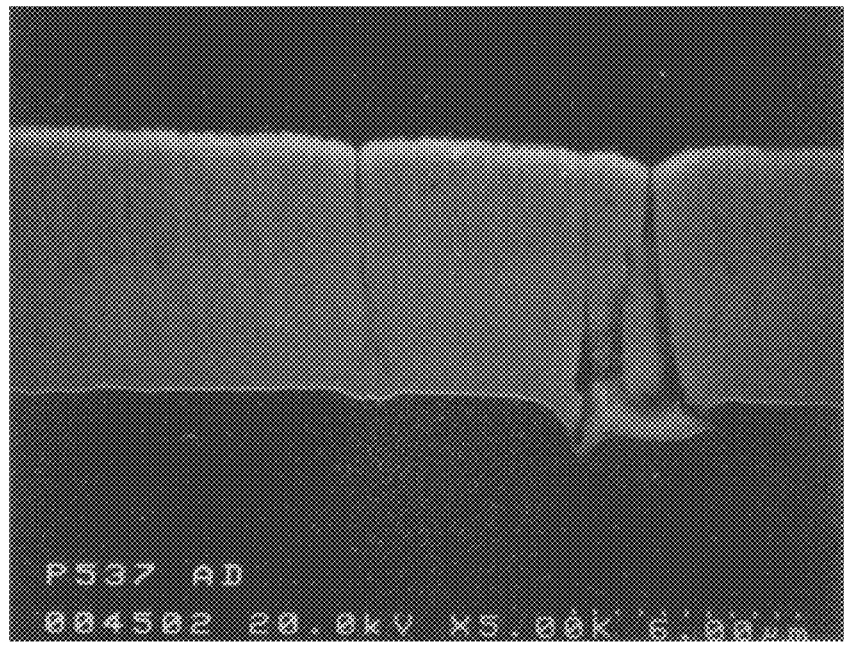
FIG. 1 shows a scanning electron micrograph, in cross section, of unleached composite material (Pt/Al alloy) deposited on Vasco 734 steel (FIG. 1A and FIG. 1B represent two samples).
Figure 1B:
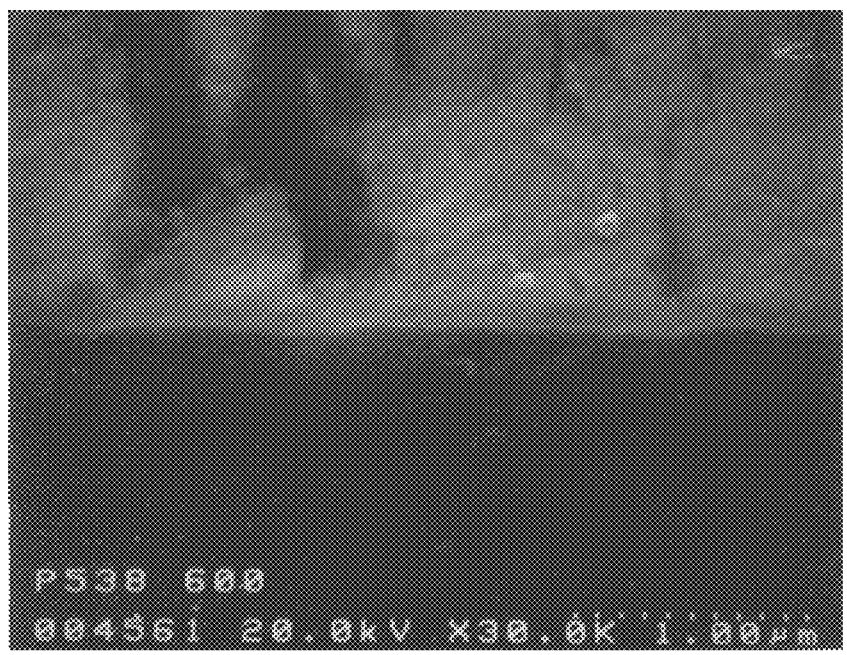

Scanning electron micrographs presented in FIG. 1 show the cross section of 2 samples of as-deposited (i.e. not yet leached) composite materials. The microstructure of the coating evolved from a well adhered equiaxed structure, at the coating/substrate interface, into a columnar structure as the film thickened.

The structure of thick evaporated coatings are known in the art to depend on the deposition conditions such as substrate temperature, background gas pressure and, where applicable, on substrate bias voltage (See B. A. Movchan and V. Demchishin, *Phys. Met. Metallogr.*, 28, 83 (1969); J. A. Thornton, *J. Vac. Sci. Tech.*, 12, 830 (1975); R. Messier and J. E. Yehoda, *J. Appl. Phys.*, 58(10), 3739 (1985)). In particular, the columnar structure seems to be favored by conditions that reduce the mobility of atoms, impairing their ability to overcome the effects of shadowing. The formation of the columnar structure, therefore, is facilitated by low substrate temperatures, high background gas pressures, and low substrate bias voltages.

The structure consists of tapered columns which are separated by voided boundaries. The columns show a fractal character in that they are made up of thinner columns, and the thinner columns are made up of yet thinner columns, and so on.

Figure 2A:
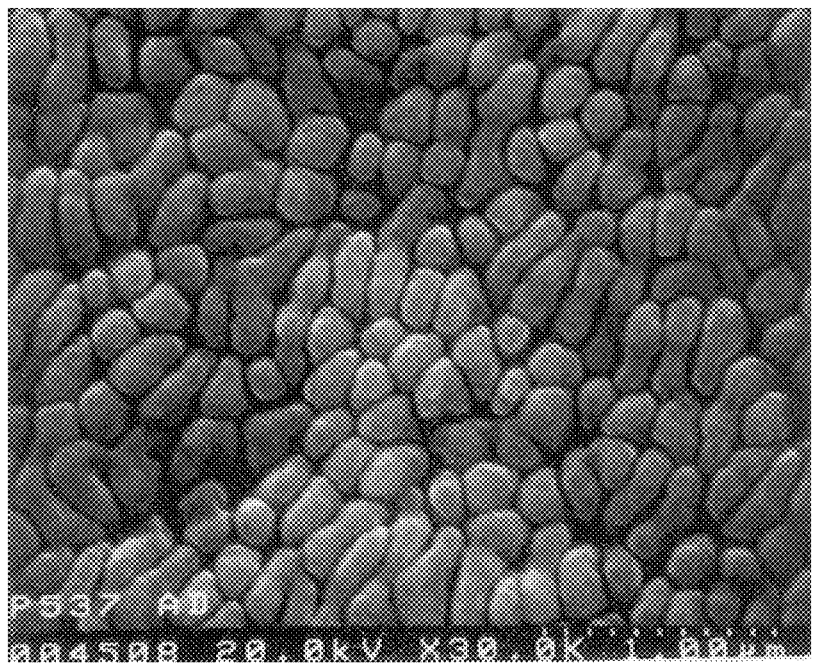
FIG. 2 shows a scanning electron micrograph, in planar view, of unleached composite material (Pt/Al alloy) deposited on 316 stainless steel (FIG. 2A and FIG. 2B represent two samples).
Figure 2B:
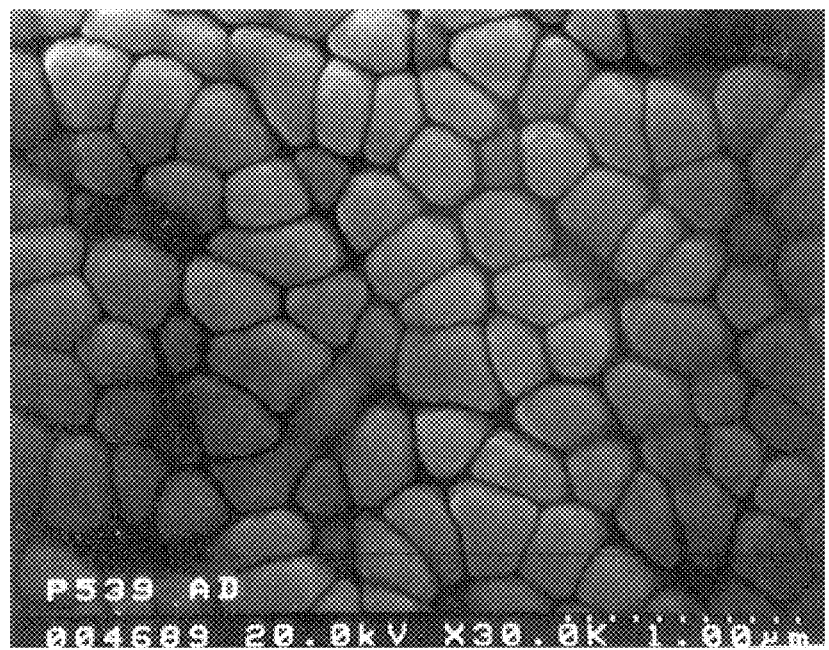
Figure 3A:
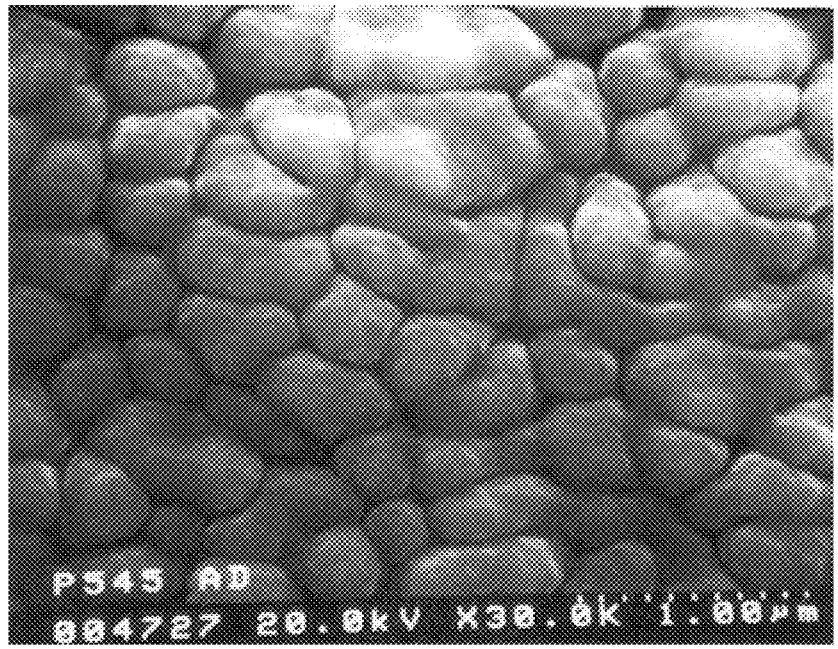
FIG. 3 shows a scanning electron micrograph, in planar view, of unleached composite material (Pt/Al alloy) deposited on 316 stainless steel (FIG. 3A and FIG. 3B represent two samples).
Figure 3B:
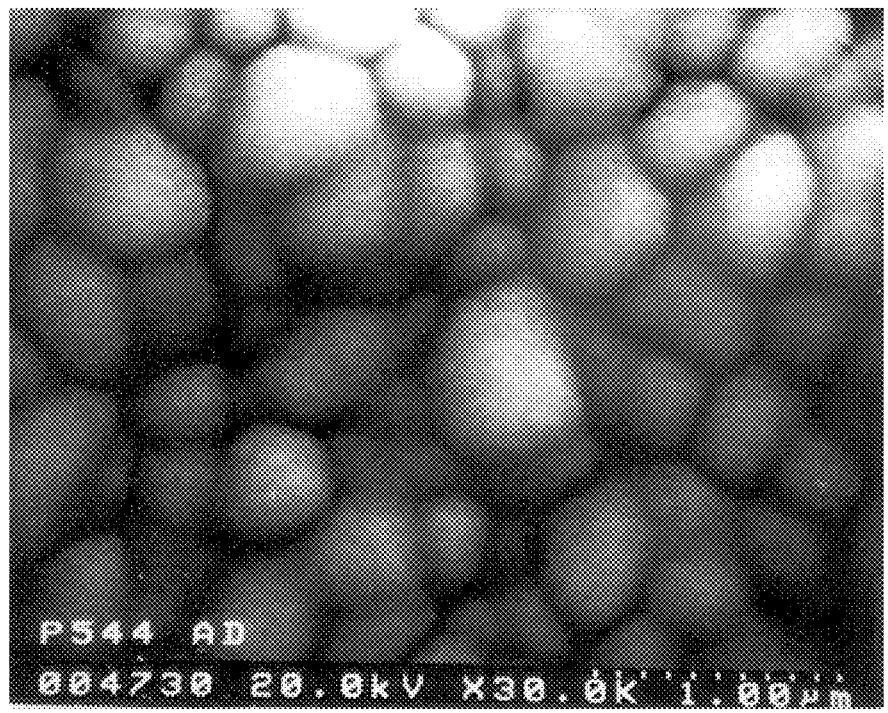

In the Al:Pt skeletal columnar coatings prepared, the column diameter apparently depended on the percent of aluminum ions in the as-deposited coating as indicated in FIG. 2 (8.5 $\mu$m and 7.0 $\mu$m coatings) and FIG. 3 (12 $\mu$m coatings). In both cases, column diameter scaled inversely with the Al:Pt ratio of the as-deposited material.

Coatings in FIG. 2 and FIG. 3 were grown under identical conditions of power delivered to the metal sources during deposition, and their direct comparison indicates that the column diameter scaled directly with film thickness. This dependence, however, is rather weak and, therefore, the resulting columns have a high aspect ratio.

Figure 4A:
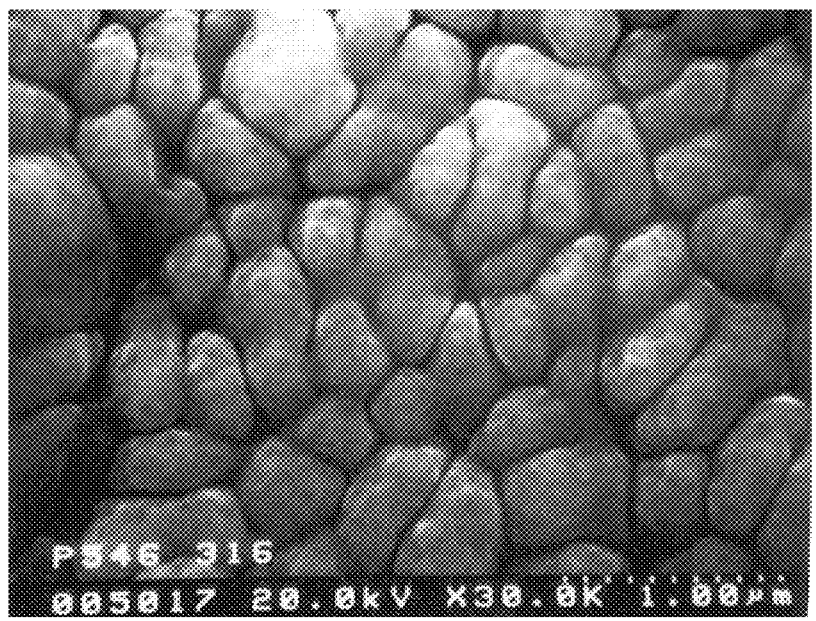
FIG. 4 shows a scanning electron micrograph, in planar view, of unleached composite material (Pt/Al alloy) deposited on 316 stainless steel FIG. 4A, (top) and Vasco 734 steel FIG. 4B, (bottom).
Figure 4B:
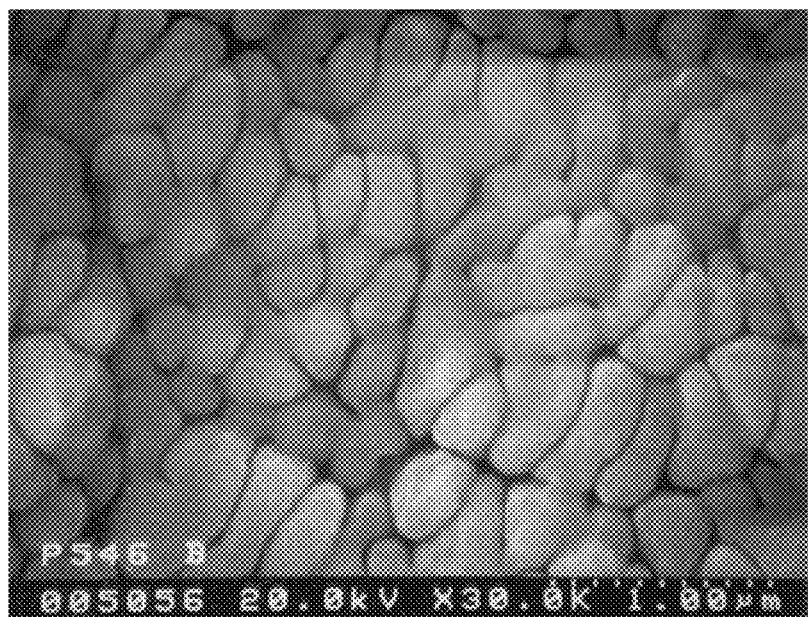

Column diameter apparently depends also on the nature of the substrate. For instance, in FIG. 4 are presented scanning electron micrographs of a coating simultaneously deposited on 316 stainless steel and Vasco 734 steel (a commercially available steel containing, 11% Cr, 10.5% Ni, 1.25% al, 0.3% Ti and 0.015% C, balance iron). The coating on the Vasco 734 steel has thinner columns than on the 316 stainless steel substrate. Although not bound by any particular theory, it is believed that this effect has to do with the enhancement in substrate ion current during deposition effected by the ferromagnetic character of Vasco 734 steel during the deposition of the Al—Pt precursor coating. Similar results have been derived when using 15-5 PH stainless steel substrates which are also ferromagnetic.

The condensation of vapors or particulates onto a substrate held at a temperature much lower than the melting point of the condensing species usually inhibits the formation of the equilibrium phases in the coating. In extreme cases, fully amorphous coatings can be formed. In addition, heterogeneous distributions of species within the coatings, which could be the result of heterogeneous delivery of these species in the coating environment, do not have the opportunity to intimately mix. Heat treatments following vapor deposition are an optional means to achieve a more uniform distribution of the equilibrium crystalline phases. As-deposited columnar Al—Pt structures, for example, can be conveniently heat treated below the melting point of Al without inducing changes in the size or shape of the columns.

The columnar structure uniquely facilitates the transfer of reactants during the selective chemical leaching of the precursor alloy. In addition, the columnar structure facilitates the preservation of coating integrity during the vigorous leaching/activation process. These characteristics of columnar structures uniquely extend the upper limit in Al content of precursor stoichiometries that can be successfully leached.

The columns are characterized by an elliptical cross section. Like any ellipse, the cross section of the columns has major and minor axes. Preferably, the length of the minor axis of the ellipse is below ten micrometers and the height of the column is greater than the dimension of the minor axis.

The columnar nature of the coatings of the present invention is the key attribute governing their resulting pore distribution in the activated state. This state is characterized by the voided spaces between activated columns (inter-columnar porosity) and the much smaller voids produced within the activated columns (intra-columnar porosity). Preferably, the inter-columnar porosity is greater than one hundred nanometers and the intra-columnar porosity is less than one hundred nanometers.

Figure 5A:
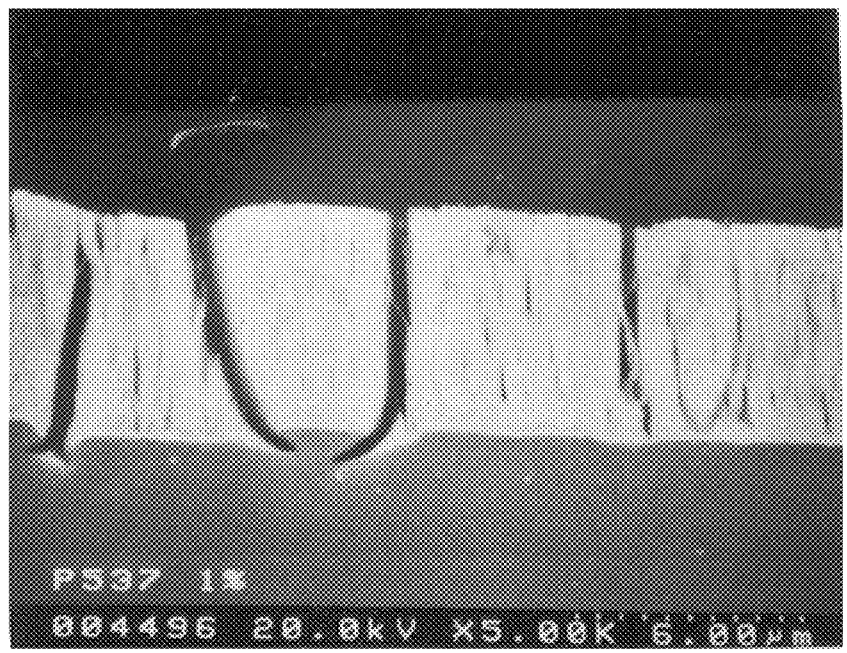
FIG. 5A and FIG. 5B represent(2 different leaching methods).
Figure 5B:
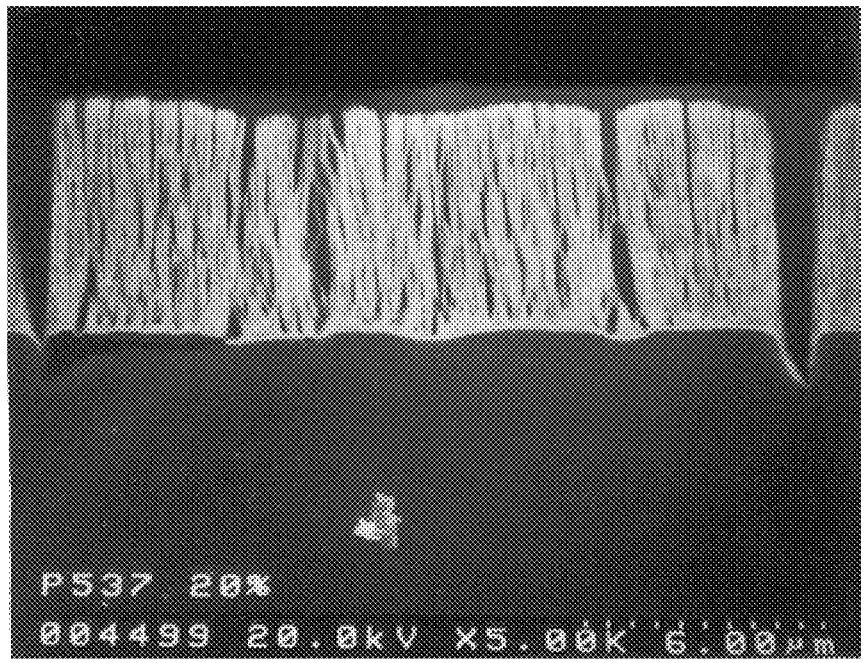

FIG. 5 shows cross-sections for a coupon following activation treatments in 1 wt. % NaOH (FIG. 5A) and 20 wt. % NaOH (FIG. 5B). Prior to activation, the columnar coating had a 32:68 Pt/Al stoichiometric ratio. The coating synthesis procedure yields a well adhered columnar structure capable of withstanding the rigors of chemical activation. The following micro structural changes are worth noting: (a) the columnar structure of the as-deposited coating is preserved, (b) columns reduce their size as a result of the leaching of Al, increasing the inter columnar distance.

The increase in inter-columnar spacing that takes place upon activation depends on the extent of Al removal. The observed tendency in our experiments is that a higher Al content in the as-deposited columns enhances a more uniform increase in the spacing of the columns. This effect leads to a narrower inter-column pore size distribution.

The intra-columnar porosity depends on the leachability of the Al—Pt phases present within the columns, which in turn is primarily determined by the Al composition and the degree of crystallinity of these Al—Pt phases. In the extreme, phases that are too rich in Al can be completely leached out of the system, and phases that are too poor in Al are not leached at all. The size and volume fraction of the first kind of Al-rich phases will determine the upper limit in intra-columnar porosity. The volume fraction of the difficult-to-leach phases will determine the residual Al content of the leached structures. Heat treatments have the effect of making uniform the Al distribution between phases and of enhancing the attainment of equilibrium crystallinity (ordered atomic structures). These treatments, therefore, provide a means for reducing both the upper limit and spread for the size distribution in intra-columnar pores, and the Al content of the leached structure.

The bimodal character of the pore distribution in the activated columnar coatings makes them exceedingly effective at catalyzing the oxidative gasification of oligomers in air at high temperatures. We believe that the removal mechanism is governed by the kinetics of capillary penetration which, by virtue of its strong dependence on capillary radius as denoted in the well known Washburn equation, strongly favors the wet out of inter-columnar pores. Intra-columnar pores, in consequence, are not readily wetted out by the fluid and, therefore, they act preferentially as a conduit for transport of gaseous species.

A variety of substrates are usable in the present invention, for example, wafers of stainless steel 316L, stainless steel 15-5 PH, Vasco 734 steel, glass and Kapton® polyimide film (available from DuPont, Wilmington, Del.) were utilized in test work. Use of wafer shapes is for example purposes only, and the process can be applied to a variety of surface shapes.

Test wafer shaped substrates were cleaned prior to the initial process step. Inorganic samples were either ultrasonically degreased in an organic solvent or in a 20 wt. % aqueous NaOH solution, followed by water rinsing, and acetone wash. Kapton® polyimide film was only acetone cleaned. It is then desirable to subject the substrate to ion bombardment using Argon low pressure plasmas (or Argon ion beams) as a final cleaning step, preferably in the same device subsequently used for the deposition of the adhesive interlayer. In the work described herein, a low pressure glow discharge sputtering reactor was used to carry out these operations. The magnetron sputtering process is particularly well suited for this application on account of its ability to produce well adhered coatings having controlled stoichiometries and microstructures. Other sources for delivery of mass and energy in a low pressure reactor could also be utilized. These would include, for example, thermal evaporation, laser evaporation, ion beam sputtering, arc discharge sputtering and other similar methods.

The adherent interlayer is formed (process step a) on the substrate by vapor deposition, followed by formation (process step b) Qf a precursor overlayer of a metal/ leachable material composite on said adherent interlayer again by vapor deposition (in the same reactor if desired).

Included are embodiments where the coating comprises a base structure comprising a composition which is a graded mixture between that of the substrate and that of the columnar structure.

This metal/leachable material consists of a multicomponent alloy system comprising the catalytic elements of choice (metal) and a co-deposited leachable material. Through-thickness composition is carefully controlled by independently delivering biasing power levels to different electrodes holding the target materials of choice (metal and leachable material) while the support is repeatedly transported under each and all bombarded targets. Elemental mixing, if required, can be achieved by the balance between power delivered to a given target and residence time of the support under that given target. Through-thickness microstructure may be carefully controlled through proper management of ion bombardment of the support during vapor deposition.

Further, an additional non-metallic, yet non-leachable material, for example a ceramic material, may be co-sputtered onto the substrate along with the metal and leachable material. Ceramic materials usable in this embodiment include alumina, titania and chromia.

After both the adherent interlayer and the metal/leachable material layers are deposited, the layers are stabilized by a thermal treatment (process step c) In particular, this is necessary when two or more sources having different compositions are used for vapor deposition of the metal/ leachable material composite layer. In this case, the spatial separation between these sources enhances the formation of the metal/leachable material composite layer composed of a periodic sequence of sub-layers having different compositions. Heat treatments have the effect of making the Al distribution uniform between the sublayers and of enhancing the attainment of equilibrium crystallinity (i.e., ordered atomic structures).

As-deposited columnar structures, for example, can be conveniently heat homogenized below the melting point of Al without inducing changes in the size or shape of the columns.

Coated specimens are heat treated, optionally in a reducing media, e.g., in an Argon-3.7% hydrogen atmosphere. The temperature range is selected so that the temperature is below the melting point of the lowest melting component in the layers. Temperatures of 400° C. to 600° C. are preferentially used. The time of the heat treatment is chosen to be long enough to complete the formation of the equilibrium crystalline phases. For instance, at 600° C. at least 2 hours were sufficient to reach equilibrium in Al—Pt coatings. X-ray diffraction analysis can be used to confirm that the heat treatment is effective.

After the layer comprising a metal/leachable material composite is in place and heat treated, activation is realized through the preferential leaching out of the leachable materials (process step d). Selection of leaching chemistries must consider the potential weakening of the substrate—adherent layer interface, resulting from the inherent chemical resistance of the support, and/or the galvanic activity and/or the dilation stresses that develop during the leaching operation. Controlled through-thickness stoichiometric gradients, where the amount of leachable material increases towards the surface of the coating, maximize the trade-off between mechanical stability and catalytic activity of the leached coating.

The surface chemistry of the pores resulting from the leaching step can be further modified by immersing the leached body in either oxidizing or reducing chemical solutions. Controlled-atmosphere thermal treatments can also be used to modify the pore surface chemistry and to improve the durability of the leached microstructures in service.

Advantages of skeletal columnar coatings as provided by this invention are higher catalytic activity and acceptable abrasion resistance at these higher activities. For example, skeletal columnar Pt coatings, synthesized as per procedures described above, have a superior ability at oxidizing oligomeric deposits on nylon spinneret faces, and are substantially more abrasion resistant than those based on the decomposition of organometallic paints (Pt nitrite) as disclosed in U.S. Pat. No. 3,849,177, or those based on the wet chemical reduction of Pt salts. In addition, such coatings have similar abrasion resistance but superior oxidation catalytic performance to those based on $MnO_2$ particulates segregated in a silicate binder matrix (such as the Vyloc® catalyst coating available from DuPont).

Skeletal metal/ceramic structures produced by the processes of this invention are expected to possess exceptional abrasion resistance.

Advantages of the process derived herein include the fact that the vapor phase synthesis route is far superior to wet electrochemical or wet chemical routes in terms of its ability to yield complex multi-component coatings and, further, the vapor deposition route allows for the synthesis of any metallurgical or cermet nanocomposite composition without the limitations of conventional metallurgical synthesis methods that usually require several thermomechanical processes to fabricate a body with adequate purity and microstructure. In most instances, the synthesized materials do not survive these thermomechanical treatments. In addition, vapor synthesis routes using as one of the targets a ceramic material can yield cermet coatings having a graded ceramic/metal stoichiometry ratio across the thickness of the coating. Alternate synthesis methods for cermet coatings, for example thermal spraying techniques, can also be used in accord with the process of the present invention. Co-spraying elemental or pre-alloyed metallic and ceramic powders would yield a cermet coating capable of being activated by the chemical leaching step of the process of the present invention.

EXAMPLES

Precursor layer formation:

Cleaned catalyst substrate wafers were placed on the table of a low pressure plasma reactor, and were subjected to ion bombardment in 10 mTorr Ar, by delivering 500 watts of RF power to the table to bias it. After 20 minutes of plasma cleaning, a 316L stainless steel target was ignited at 1 kilowatt in the DC magnetron mode to yield a well adhered layer deposited on the specimens that were repeatedly transported under this target. After 15 minutes of biased deposition, the table was grounded and a second target (platinum) was coignited at 1.5 kilowatts in the RF diode mode to derive an intimately mixed stainless steel/platinum layer that was deposited for 10 minutes. A third target (aluminum) was coignited in the DC magnetron mode and the stainless steel target was deignited after 3 minutes. Power to the Al target was adjusted to yield a co-deposited Pt—Al layer having a given stoichiometry. Overall coating thickness was determined by the deposition time.

These deposition conditions yielded well adhered columnar structure coatings. For a given thickness, the diameter of the columns scaled with the aluminum content. In these examples, the Al atomic composition range from 0.5 to 0.85% was covered.

X-ray diffraction analysis determined that the as-deposited coatings exhibited compositional modulation and some degree of amorphicity. Intermetallic phases having a well defined crystallinity were not formed.

Thermal stabilization step:

The coated specimens were then heat treated in an Ar-3.7% $H_2$ atmosphere. The temperature range was 400° C. to 600° C.; and the specimens were held for a period of time long enough to complete the formation of the equilibrium crystalline phases. For instance, at 60° C. at least 2 hours were sufficient to reach equilibrium. X-ray diffraction analysis confirmed that the heat treated coatings were constituted by a complex mixture of well defined crystalline intermetallic phases.

Activation step:

The coated specimens were then immersed in chemical solutions as per the alternate procedures described below.

Procedure A) immersion in de ionized water held at room temperature, followed by dropwise addition of 1 wt. % aqueous NaOH solution. Moderate hydrogen bubbling started when a threshold caustic dosage was reached. Dosage with 1% caustic was discontinued well past the end of bubbling.

Procedure B) immersion in de ionized water held at room temperature, followed by dropwise addition of 50 wt. % NaOH until the immersion solution reached 20 wt. % caustic content. The heat of solution elevated the temperature to 50° C. Bubbling was more vigorous than in Procedure A.

Procedure C) immersion in 20 wt. % NaOH solution held at room temperature for up to 120 minutes, vigorous bubbling.

Procedure D) immersion in 20 wt. % NaOH solution held at 40° C. for 30 minutes; vigorous bubbling.

Procedure E) immersion in 20 wt. % NaOH solution held at 40° C. for 5 minutes, followed by five similar reimmersions in fresh solutions; vigorous bubbling.

Procedure F) immersion in 20 wt. % NaOH at room temperature for 30 minutes, followed by immersion in 20 wt. % NaOH solution at 80° C. for additional 30 minutes.

Procedure G) same as E and followed by immersion in 3.7% HCl solution at room temperature for up to 5 minutes.

Procedure H) same as E and followed by immersion in 3.5% nitric acid solution at room temperature for up to 5 minutes.

Procedure I) same as F, followed by immersion in 3.5% nitric acid solution at 75° C. for up to 30 minutes.

Procedure A was only partially successful because it usually left re deposited material (hydroxylated compounds) on the specimens. Procedures B through F removed approximately 60% of the Al present in the as deposited coating (as determined by energy dispersive X-ray analysis). Procedures G and H removed a higher fraction of the Al. For most applications explored to date, the preferred procedure is Procedure I. In all procedures finishing with acid treatment, the acid exposure must be carefully monitored and controlled to eliminate excessive damage to the substrate, which could lead to total delamination of the skeletal coating.

For all activation methods, the efficiency of Al removal scaled directly with the Al content of the as-deposited precursor layer.

The activated specimens were tested for catalytic removal of deposits using thermogravimetric analysis ("TGA"). To this end, catalyzed foils were solvent-impregnated with nylon oligomers of choice, and their TGA behavior in gases containing differing amounts of oxygen was compared to that of control specimens. Oligomer removal efficiency scaled with the thickness and/or the purity of the skeletal coating (both influence the total active surface area) and the temperature of the specimen. These parameters effected directly the two proposed mechanisms governing the gasification of these solvent-impregnated oligomers: thermally activated desorption, and oxidative breakdown.

In another set of experiments, activated coatings held at a high temperature in laboratory air were tested for the gasification of oil drips delivered from a microsyringe held at room temperature. Under these conditions, the oil drips had the tendency to wet out the intercolumnar porosity of the coating before being catalytically gasified. The removal performance, in this case, peaked at an optimum temperature, which defined the cross-over temperature above which thermal degradation of the oligomer (leading to poor pore wet out) was faster than oxidative gasification.

What is claimed is:

1. A skeletal columnar coating on a substrate, comprising:
    (1) a substrate; and
    (2) an adhered columnar structure on said substrate which provides intercolumnar porosity between columns of said columnar structure and comprises (a) an adherent interlayer, and (b) an overlayer which comprises a catalytic alloying element and provides intracolumnar porosity, the columns of said columnar structure having an elliptical cross section with a major axis and a minor axis and the length of the minor axis being below ten micrometers; the columns having a height which is longer than the minor axis of the column cross-sections; and
    the intracolumnar porosity being provided by voids which are smaller than the voided spaces between the columns of said columnar structure.

2. The composition of claim 1 wherein the catalytic alloying element is selected from the group consisting of cobalt, copper, gold, iridium, nickel, palladium, platinum, rhenium, rhodium, ruthenium, silver, and combinations thereof.

3. The coating of claim 1 wherein the columnar structure comprises a metallic alloy.

4. The coating of claim 3 wherein the metallic alloy comprises
    a) a catalytic alloying element selected from the group consisting of cobalt, copper, gold, iridium, nickel, palladium, platinum, rhenium, rhodium, ruthenium and silver, and combinations thereof, and b) a non-catalytic alloying element selected from the group consisting of aluminum, chromium, hafnium, magnesium, molybdenum, niobium, tantalum, tin, titanium, tungsten, vanadium, zinc and zirconium, and combinations thereof.

5. The coating of claim 4 wherein the catalytic alloying element is platinum and the non-catalytic alloying element is aluminum.

6. The coating of claim 1 wherein the columnar structure further comprises a ceramic selected from the group consisting of alumina, titania, chromia, and combinations thereof.

7. The coating of claim 1 wherein said intercolumnar porosity is greater than one hundred nanometers and wherein said intracolumnar porosity is less than one hundred nanometers.

8. The coating of claim 1 wherein the interlayer disposed between the substrate and the overlayer comprises a composition which is a graded mixture of material comprising the substrate and material comprising the overlayer.

9. The coating of claim 1 wherein said substrate is selected from the group consisting of metallic alloys and ceramic alloys.

10. A skeletal columnar coating on a substrate, comprising:

(1) a substrate; and (2) an adhered columnar structure on said substrate which provides intercolumnar porosity between columns of said columnar structure and comprises (a) an adherent interlayer, and (b) an overlayer which comprises a catalytic alloying element and provides intracolumnar porosity, the interlayer comprising a graded mixture of substrate material and overlayer material; and the intracolumnar porosity being provided by voids which are smaller than the voided spaces between the columns of said columnar structure.

* * * * *